United States Patent [19]

Ogihara

[11] Patent Number: 4,980,863
[45] Date of Patent: Dec. 25, 1990

[54] SEMICONDUCTOR MEMORY DEVICE HAVING SWITCHING CIRCUIT FOR COUPLING TOGETHER TWO PAIRS OF BIT LINES

[75] Inventor: Masaki Ogihara, Yokohama, Japan

[73] Assignee: Kabushiki Kaisha Toshiba, Kawasaki, Japan

[21] Appl. No.: 517,384

[22] Filed: Apr. 30, 1990

Related U.S. Application Data

[63] Continuation of Ser. No. 358,535, May 30, 1989, abandoned, which is a continuation of Ser. No. 174,393, Mar. 29, 1988, abandoned.

[30] Foreign Application Priority Data

Mar. 31, 1987 [JP] Japan ................................ 62-75900

[51] Int. Cl.$^5$ .......................................... G11C 11/407
[52] U.S. Cl. ................................... 365/205; 365/190; 365/233; 365/193
[58] Field of Search ............... 365/190, 205, 207, 208, 365/222, 233, 193

[56] References Cited

U.S. PATENT DOCUMENTS

| 4,542,483 | 9/1985 | Procyk .................................. 365/190 |
| 4,730,280 | 3/1988 | Aoyama .............................. 365/190 |
| 4,739,500 | 4/1988 | Miyamoto et al. .................. 365/222 |
| 4,764,901 | 8/1988 | Sakurai ................................ 365/222 |

FOREIGN PATENT DOCUMENTS

0129651 1/1985 European Pat. Off. ............ 365/205

Primary Examiner—Glenn Gossage
Attorney, Agent, or Firm—Finnegan, Henderson, Farabow, Garrett, and Dunner

[57] ABSTRACT

A semiconductor memory device comprises a memory section of a dynamic type, a pair of first bit lines connected to the memory section, which are set to different potentials in accordance with data read out from the memory section, a pair of second bit lines, a switching circuit connected between the pair of first bit lines and the pair of second bit lines for transmitting the potential difference between the first bit lines to the pair of second bit lines, and a sense amplifier circuit connected to the pair of second bit lines for sensing and amplifying the potential difference between the second bit lines. The semiconductor memory device further comprises a control circuit for turning off the switching circuit after the data has been read out from the memory section and before an increase of the potential difference between the first bit lines has substantially finnished, and a second sense amplifier circuit connected to the first bit lines for sensing and amplifying the potential difference between the first bit lines to store data equivalent to the readout data in the memory section.

30 Claims, 7 Drawing Sheets

SEMICONDUCTOR MEMORY DEVICE HAVING SWITCHING CIRCUIT FOR COUPLING TOGETHER TWO PAIRS OF BIT LINES

This application is a continuation of application Ser. No. 07/358,535, filed May 30, 1989, now abandoned, which is a continuation of application Ser. No. 07/174,893, filed Mar. 29, 1988, now abandoned.

BACKGROUND OF THE INVENTION

1. Field of the Invention

This invention relates to a semiconductor memory device, and more particularly to a dynamic RAM.

2. Description of the Related Art

In general, the data readout operation in a DRAM is effected by first selecting a memory cell, amplifying a minute potential difference occurring at this time between a pair of bit lines by means of a sense amplifier circuit, and then transferring the potential difference between the bit lines to a pair of data lines after the logic value "1" or "0" of the data is determined. Recently, the integration technology for DRAM has greatly advanced. With the advance in the integration technology, a parasitic capacitance between the pair of bit lines and a semiconductor substrate tends to increase and a memory cell capacitance tends to decrease. Therefore, it will take a long time to complete the sense amplifying operation of the sense amplifier circuit. Various attempts have been made to provide a circuit which can reduce the time.

Figure 1:
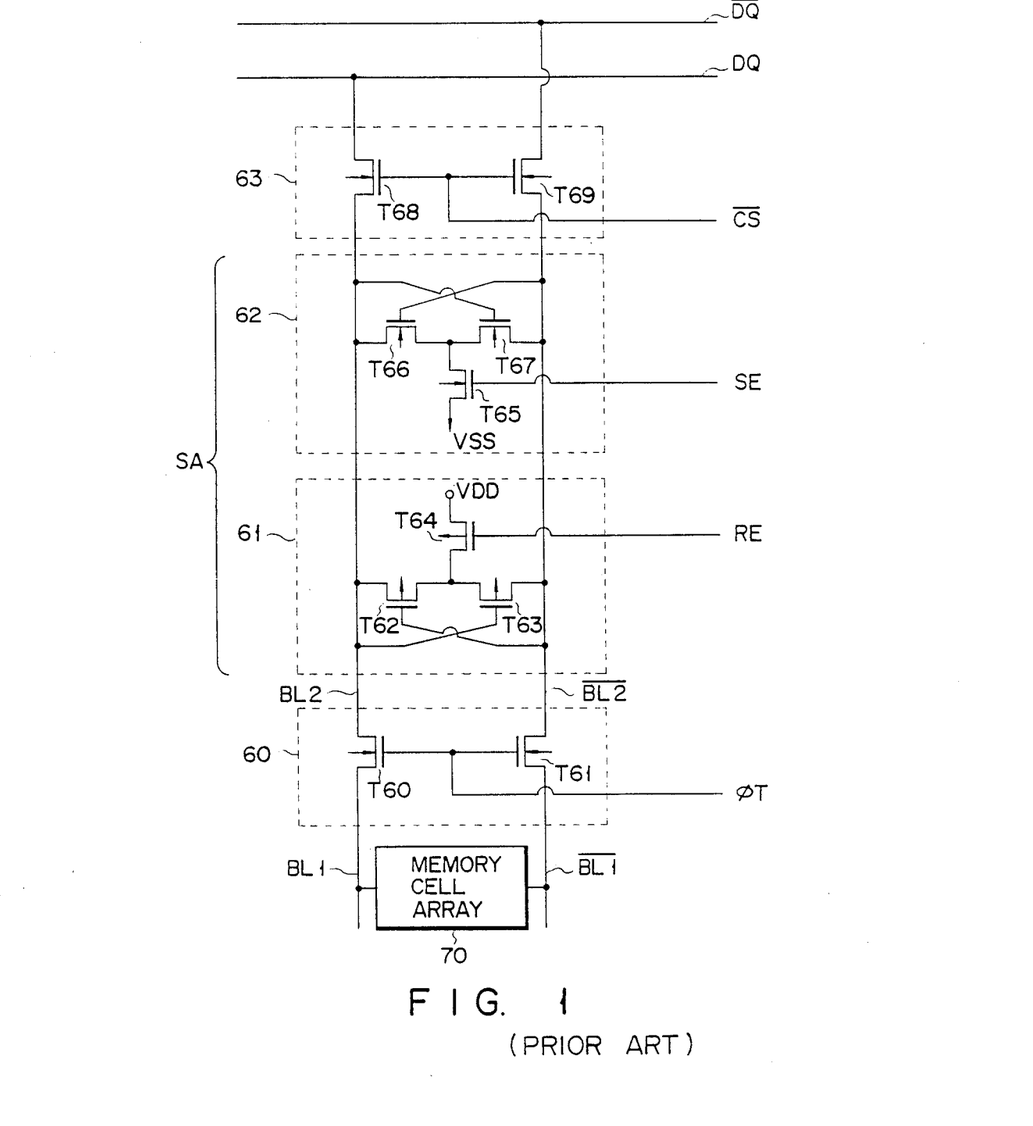
FIG. 1 is a circuit diagram showing part of a conventional DRAM.

FIG. 1 shows part of a circuit of the conventional DRAM. In the DRAM, barrier circuit 60 is connected between a pair of first bit lines BL1, $\overline{BL1}$ and a pair of second bit lines BL2, $\overline{BL2}$, switching circuit 63 is connected between second bit lines BL2, $\overline{BL2}$ and a pair of data lines DQ, $\overline{DQ}$, and sense amplifier circuit SA is connected between second bit lines BL2 and $\overline{BL2}$.

Sense amplifier circuit SA includes first and second amplifier 61 and 62.

Barrier circuit 60 includes transistors T60 and T61, and barrier control signal ΦT is supplied to the gates of transistors T60 and T61. Transistors T60 and T61 are set in such conduction states as to serve as resistors in a latching process, and serve as good conductors in a restore process.

In the actual data readout operation, each of transistors T60 and T61 is first set in such a conduction state as to serve as a resistor. Then, data is read out from memory cell array 70 to the pair of bit lines BL1 and $\overline{BL1}$. At this time, bit lines BL1 and $\overline{BL1}$ are set at different potentials in accordance with the readout data. The potential difference is transmitted to bit lines BL2 and $\overline{BL2}$ via transistors T60 and T61. The potential difference between bit lines BL2 and $\overline{BL2}$ is sensed and amplified by sense amplifier circuit SA. Second amplifier 62 sets the potential of one of bit lines BL2 and $\overline{BL2}$ to "VSS" level, and first amplifier 61 sets the potential of the other one of bit lines BL2 and $\overline{BL2}$ to "VVD" level. After the potential change in each of bit lines BL2 and $\overline{BL2}$ have almost completed, transistors T68 and T69 are set conductive. The potentials of data lines DQ and $\overline{DQ}$ are set to equivalent levels to respective bit lines BL2 and $\overline{BL2}$ as data "0" or "1". Then, transistors T60 and T61 are set fully conductive to effect the restore process. At this time, the potentials of bit lines BL2 and $\overline{BL2}$ are transmitted to bit lines BL1 and $\overline{BL1}$ through barrier circuit 60 to store the same data as readout data or in memory cell array 70.

As described above, in the case where barrier circuit 60 which has transistors T60 and T61 serving as resistors in the latching process is provided, variation in potentials of second bit lines BL2 and $\overline{BL2}$ having a small parasitic capacitance can be sensed and amplified in a relatively short period of time.

However, the conventional DRAM has the following defects:

In order to reduce the time required for completing the sense amplifying operation in which variation in potentials of second bit lines BL2 and $\overline{BL2}$ is sensed and amplified, it is preferable that transistors T60 and T61 have large resistances in the latching process. However, if the resistances are set relatively large, it takes a long time to transmit a minute potential difference between bit lines BL1 and $\overline{BL1}$, which is derived from a memory cell, to second bit lines BL2 and $\overline{BL2}$.

Further, if transistors T60 and T61 are set nonconductive in the latching process, time for effecting the restore process becomes considerably long.

It is possible to reduce the time for effecting the latching process by enhancing the current driving ability of sense amplifier circuit SA. However, in this case, current consumption in the DRAM is liable to abruptly vary. Power source terminals P1 and P2 of the DRAM are respectively connected to voltage sources VCC and VSS via parasitic resistors RCC and RSS (see FIG. 3). Assume that current flowing into power source terminal P1 of the DRAM is denoted by ICC and current flowing out from power source terminal P2 of the DRAM is denoted by ISS. Then, the potential at power source terminal P1 is set to (VCC−ICC×RCC) and the potential at power source terminal P2 is set to (VSS+ISS×RSS). Therefore, when the current consumption abruptly varies, the values of ICC and ISS increase, causing a potential occurring in the DRAM to be shifted from the original value.

The DRAM is connected to receive external signals such as row address control signal $\overline{RAS}$, column address control signal $\overline{CAS}$, write control signal $\overline{WE}$, and address signals A0 to A7 irrespective of the above potential shift. Therefore, the DRAM operation becomes unstable and erroneous operation may easily occur.

SUMMARY OF THE INVENTION

An object of the invention is to provide a semiconductor memory device which can improve the speed in read-out operation without impairing the reliability thereof.

The above object can be achieved by a semiconductor memory device comprising a memory section of a dynamic type; a pair of first bit lines connected to the memory section, which are set at different potentials in accordance with data read out from the memory section; a restore section connected to the first bit lines for sensing and amplifying the potential difference between the first bit lines to store data equivalent to the readout data in the memory section; a pair of second bit lines; a switching circuit connected between the pair of first bit lines and the pair of second bit lines for transmitting the potential difference between the first bit lines to the pair of second bit lines; an output section connected to the pair of second bit lines for sensing and amplifying the potential difference between the second bit lines; and a control circuit for turning off the switching circuit after the data has been read out from the memory section and before an increase of the potential difference between the first bit lines has substantially finished.

In this invention, the pair of first bit lines and the pair of second bit lines are electrically separated from each other after the potential difference between the first bit lines has been transmitted to the second bit lines. Therefore, the restore section and output section can operate in parallel, allowing the speed in reading data to be improved. Further, since it is not necessary that the period for a restoring operation be shortened more than a required level, the driving current ability of the restore circuit can be reduced. In this case, a sudden change in current consumption is prevented, and the readout operation is made reliable.

DETAILED DESCRIPTION OF THE PREFERRED EMBODIMENTS

There will now be described a DRAM according to an embodiment of this invention with reference to FIGS. 2 to 5.

Figure 2:
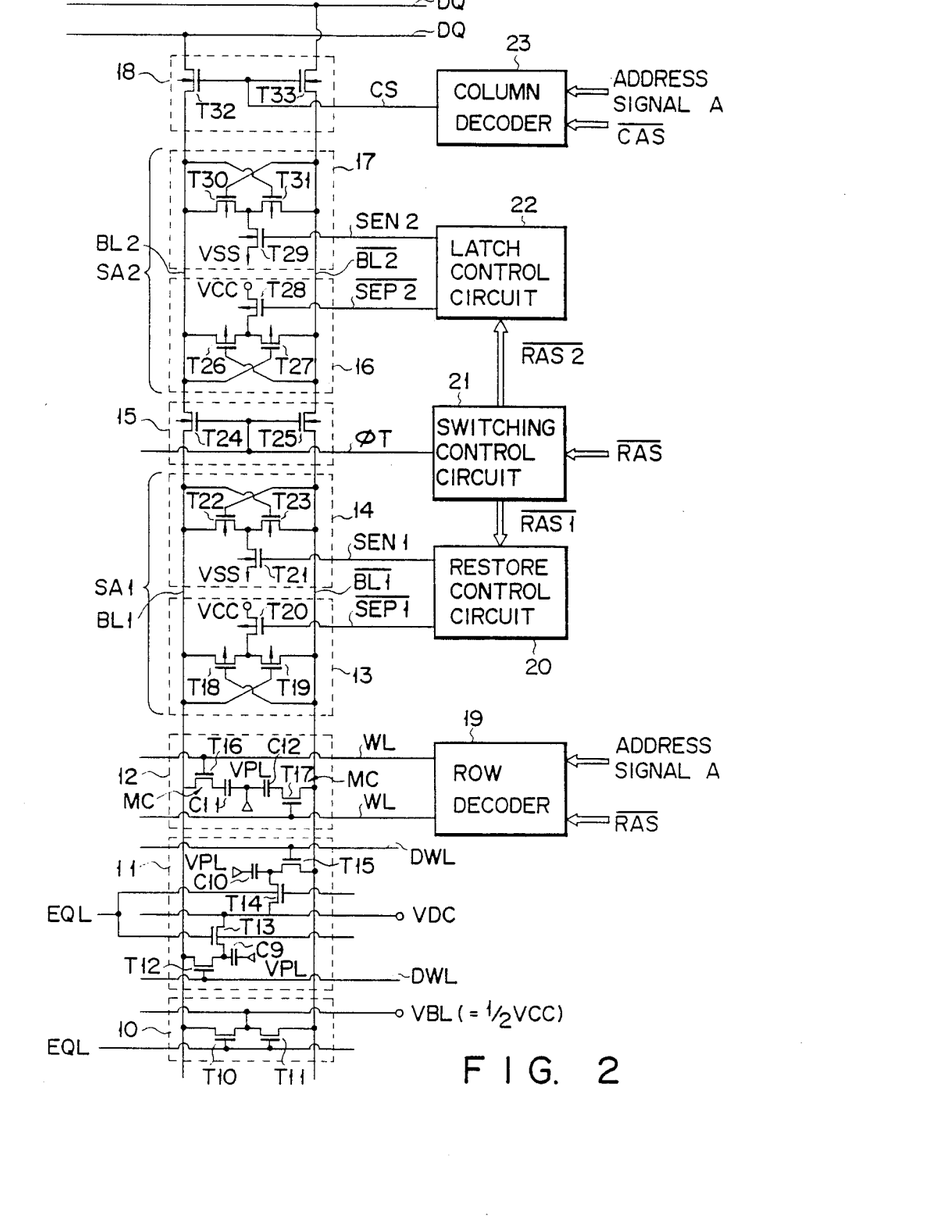
FIG. 2 is a circuit diagram showing part of DRAM according to one embodiment of this invention.
Figure 3:
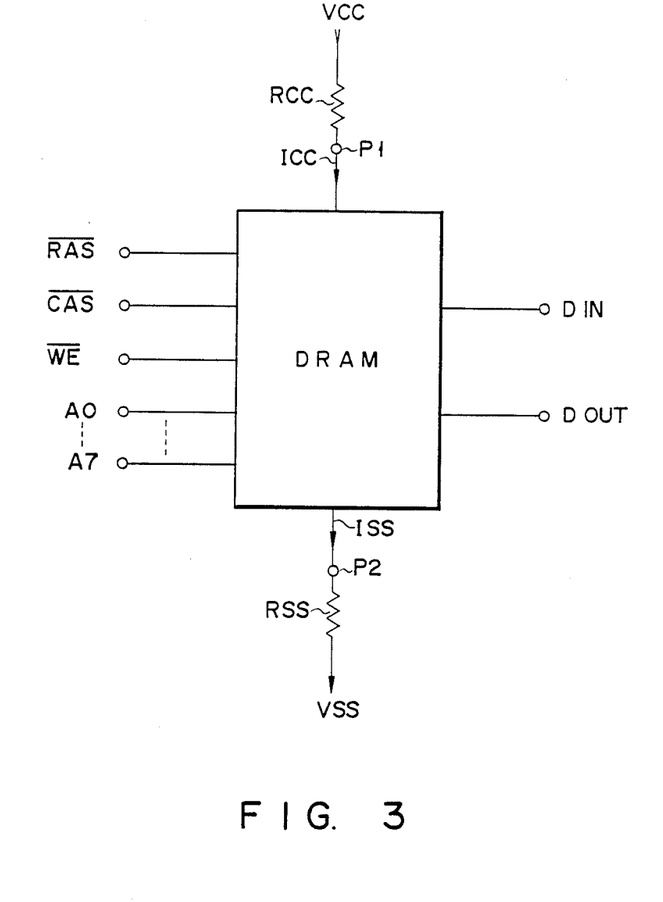
FIG. 3 shows a connection between the DRAM and external terminals.

FIG. 2 shows part of a circuit of the DRAM. FIG. 3 shows a connection between the DRAM and external terminals.

The DRAM includes precharge circuit 10, dummy cell section 11, memory cell section 12, first and second sense amplifier circuits SA1 and SA2, first and second switching circuits 15 and 18, row decoder 19, restore control circuit 20, switching control circuit 21, latch control circuit 22, and column decoder 23. Precharge circuit 10 is formed of MOS transistors T10 and T11. Dummy cell section 11 is formed of MOS transistors T12, T13, T14 and T15 and capacitors C9 and C10. Memory cell section 12 formed of MOS transistors T16 and T17 and capacitors C11 and C12. First sense amplifier circuit SA1 has first amplifier 13 formed of MOS transistors T18 to T20 and second amplifier 14 formed of MOS transistors T21 to T23. First switching circuit 15 is formed of MOS transistors T24 and T25. Second amplifier circuit SA2 has first amplifier 16 formed of MOS transistors T26, T27 and T28 and second amplifier circuit 17 formed of MOS transistors T29 to T31. Second switching circuit 18 is formed of MOS transistors T32 and T33.

Precharge circuit 10 is used to set the potentials of bit lines BL1, $\overline{BL1}$, BL2 and $\overline{BL2}$ to a voltage level which is half the power source voltage VCC. Precharge circuit 10, dummy cell section 11, memory cell section 12, and first sense amplifying circuit SA1 are connected between first bit lines BL1 and $\overline{BL1}$. Second sense amplifying circuit SA2 is connected between second bit lines BL2 and $\overline{BL2}$. First bit lines BL1 and $\overline{BL1}$ are connected to second bit lines BL2 and $\overline{BL2}$ via first switching circuit 15, and second bit lines BL2 and $\overline{BL2}$ are connected to data lines DQ and $\overline{DQ}$ via second switching circuit 18. The pair of bit lines BL2 and $\overline{BL2}$ has a shorter length than the pair of bit lines BL1 and $\overline{BL1}$. The potential difference between first bit lines BL1 and $\overline{BL1}$ is sensed and amplified by first sense amplifying circuit SA1, and the potential difference between second bit lines BL2 and $\overline{BL2}$ is sensed and amplified by second sense amplifying circuit SA2. That is, first amplifier 13 allows the potential of one of bit lines BL1 and $\overline{BL1}$ to be increased to VCC level, and second amplifier 14 allows the potential of the other one of bit lines BL1 and $\overline{BL1}$ to be decreased to VSS level. First amplifier 16 allows the potential of one of bit lines BL2 and $\overline{BL2}$ to be increased to VCC level, and second amplifier 17 allows the potential of the other one of bit lines BL2 and $\overline{BL2}$ to be decreased VSS level.

Row decoder 19 is connected to receive address signal A and row address control signal $\overline{RAS}$ and selects one of memory cells MC via word line WL corresponding to the received signals. Switching control circuit 21 is connected to receive row address control signal $\overline{RAS}$ and generates signal $\Phi T$ for controlling the operation of first switching circuit 15, signal $\overline{RAS1}$ for controlling the operation of restore control circuit 20, and signal $\overline{RAS2}$ for controlling the operation of latch control circuit 22. Restore control circuit 20 functions to generate signal SEN1 for controlling the operation of second amplifier 14 and signal $\overline{SEP1}$ for controlling the operation of first amplifier 13.

Latch control circuit 22 functions to generate signal SEN2 for controlling the operation of second sense amplifier 17 and signal $\overline{SEP2}$ for controlling the operation of first amplifier 16. Column decoder 23 is connected to receive address signal A and column address control signal $\overline{CAS}$ and generate column select signal CS for controlling the operation of second switching circuit 18.

The current driving ability of first sense amplifier circuit SA1 is set smaller than that of second sense amplifier circuit SA2.

The current driving abilities of second sense amplifier circuit SA2 is so set that variation in potential of second bit lines BL2 and $\overline{BL2}$ can be substantially completed before column address control signal $\overline{CAS}$ falls and column select signal CS rises. Switching control signal $\Phi T$ is so controlled as to fall at a preset time after row address control signal $\overline{RAS}$ has fallen, and rise after a further preset time. That is, switching control signal $\Phi T$ is controlled according to the timing of falling of row address control signal $\overline{RAS}$.

There will now be described the readout operation of the DRAM of FIGS. 2 and 3 with reference to FIGS. 4 and 5. For example, control signals SEN1, $\overline{SEP1}$, SEN2 and $\overline{SEP2}$ are so set to change at the same timing.

Figure 4:
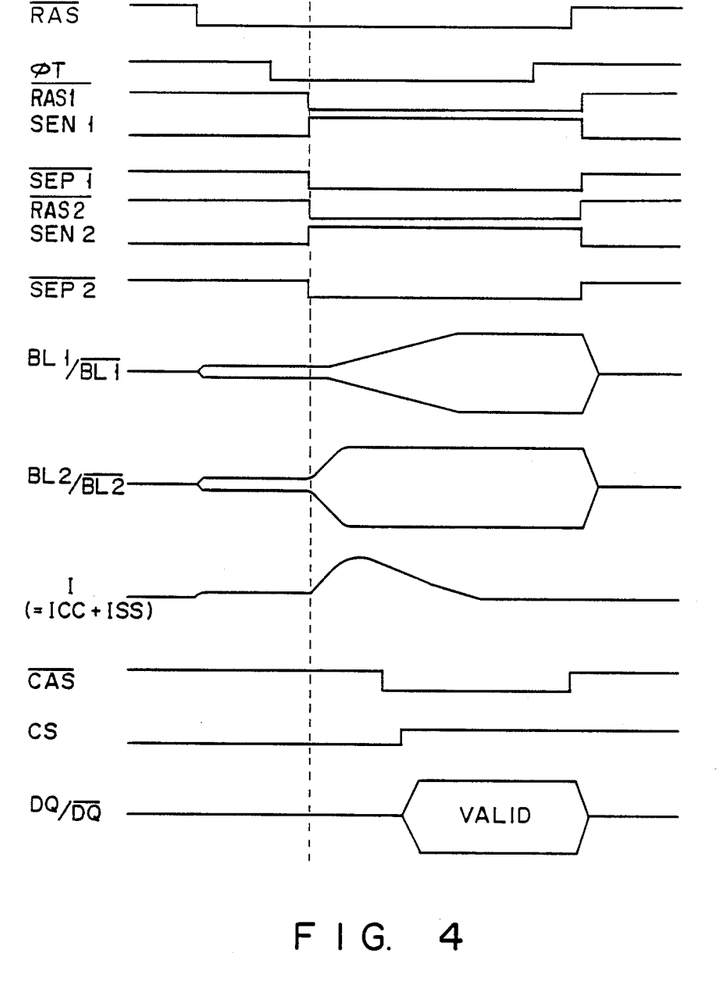
FIGS. 4 and 5 are timing charts for illustrating the operation of the DRAM shown in FIG. 2.

FIG. 4 is a timing diagram showing the operation of the DRAM in the condition described above. Current I externally supplied from or to the DRAM is the sum of current ICC supplied from voltage source VSS and current ISS supplied to voltage source VSS ($I=ICC+ISS$).

When a present time has passed after switching control circuit 21 detects that row address control signal $\overline{RAS}$ falls, it causes signal $\Phi T$ to fall. After signal $\Phi T$ has fallen, transistors T24 and T25 are set nonconductive to electrically isolate first bit lines BL1 and BL1 from second bit lines BL2 and $\overline{BL2}$.

On the other hand, when a predetermined time has passed after row address control signal $\overline{RAS}$ has fallen signal $\overline{RAS1}$ is supplied to restore control circuit 20, and at the same time signal RAS2 is supplied to latch control circuit 22. At this time, restore control circuit 20 causes signal SEN1 to rise and signal $\overline{SEP1}$ to fall, and latch control circuit 22 causes signal SEN2 to rise and signal $\overline{SEP2}$ to fall. The potential difference between first bit lines BL1 and $\overline{BL1}$ is amplified by first sense amplifier circuit SA1, and that between second bit lines BL2 and $\overline{BL2}$ is amplified by second sense amplifier circuit SA2. Since, in this case, the potential difference between first bit lines BL1 and $\overline{BL1}$ is gradually amplified due to the smaller current driving ability of SA1; and, it takes a relatively long time for the logic level thereof to be determined as "H" or "L". In contrast, since the potential difference between second bit lines BL2 and $\overline{BL2}$ is rapidly amplified due to the larger current driving ability of SA2, the logic level thereof can be determined as "H" or "L" in a relatively short period of time.

After variation in the potential of second bit lines BL2 and $\overline{BL2}$ is substantially completed, column select signal CS rises to render transistors T32 and T33 conductive. As a result, second bit lines BL2 and $\overline{BL2}$ are electrically connected to data lines DQ and $\overline{DQ}$. Therefore, the potentials of data lines DQ and $\overline{DQ}$ are set to substantially the same levels of the potentials of second bit lines BL2 and $\overline{BL2}$, and the potentials of data lines DQ and $\overline{DQ}$ are output as readout data.

When a predetermined time has passed after variations in the potentials of first bit lines BL1 and $\overline{BL1}$ and second bit lines BL2 and $\overline{BL2}$ are substantially completed and the logic levels thereof are determined, signal $\Phi T$ rises to render transistors T24 and T25 conductive. When transistors T24 and T25 are thus set conductive, first bit lines BL1 and $\overline{BL1}$ are electrically connected to second bit lines BL2 and $\overline{BL2}$ so as to make ready for the subsequent writing operation.

In the DRAM performing the readout operation shown in FIG. 4, the following effects can be attained:

When first switching circuit 15 is set nonconductive, first bit lines BL1 and $\overline{BL1}$, which are connected to the memory cell section and therefore have a large parasitic capacitance, are electrically isolated from second bit lines BL2 and $\overline{BL2}$ having a small parasitic capacitance.

Thus, in the sense amplifying operation, the potentials of second bit lines BL2 and $\overline{BL2}$ can be changed to levels representing logic value "H" or "L" in a relatively short period of time, attaining a high speed readout operation.

Further, in the sense amplifying operation, it takes a relatively long time for the potentials of first bit lines BL1 and $\overline{BL1}$ to change to levels representing logic value "H" or "L". Therefore, it is possible to reduce the time variation [dI/dt] of the total current I ($=ICC+ISS$) obtained by adding current ICC flowing via power source terminal P1 to current ISS flowing via power source terminal P2. As a result, the shift amount of the reference voltage generated in the DRAM can be suppressed to a relatively stable value. That is, the reference voltage is substantially the same as a base voltage which is used as a reference with respect to input signals $\overline{RAS}$, $\overline{CAS}$ and $\overline{WE}$, address signals A0 to A7, and the like which are supplied from the exterior of the DRAM. Therefore, erroneous operation of the DRAM can be effectively prevented. In the case where the bit lines are precharged to a level half the power source voltage VCC, bit lines BL1 and $\overline{BL1}$ are electrically connected to each other, preventing variation in current I occurring with respect to time.

In this case, the current driving ability of second sense amplifier circuit SA2 between second bit lines BL2 and $\overline{BL2}$ can be set sufficiently high, and the readout operation speed of the DRAM can be further enhanced.

Since first sense amplifier circuit SA1 is controlled independently from second sense amplifier circuit SA2, a high degree of freedom of the circuit design for first and second sense amplifier circuits SA1 and SA2 can be attained. FIG. 5 is a timing chart for illustrating the operation in the case where control signals SEN2 and $\overline{SEP2}$ change at a first timing, and control signals SEN1 and $\overline{SEP1}$ change at a second timing subsequent to the first timing. The readout operation is different from that of the DRAM in that the sense amplifying operation with respect to second bit lines BL2 and $\overline{BL2}$ is effected at an earlier timing than that with respect to first bit lines BL1 and $\overline{BL1}$. In other words, when a preset time has passed after switching control signal $\Phi T$ has fallen, signal SEN2 rises and signal $\overline{SEP2}$ falls, causing second amplifier 17 and first amplifier to start the operation. Further, after a preset time, signal SEN1 rises and signal $\overline{SEP1}$ falls, causing second sense amplifier 14 and first amplifier 13 to start the operation. The operation relating to the other signals is the same as in the case of FIG. 3.

Figure 5:
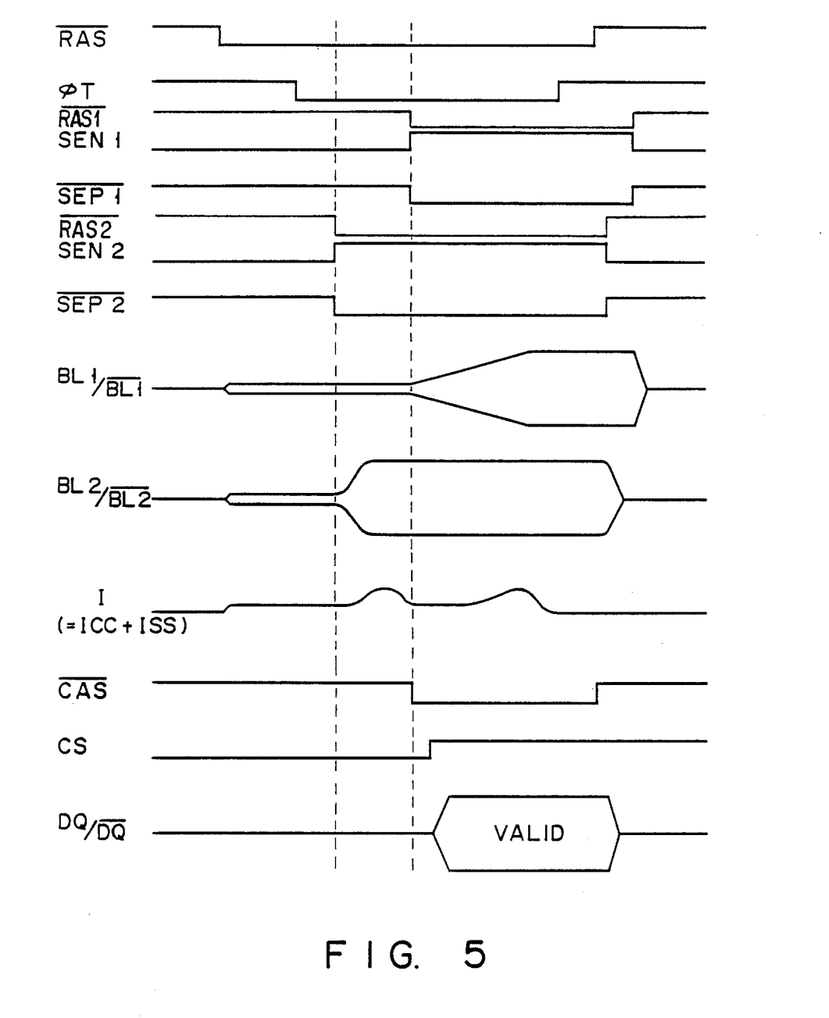

The DRAM for effecting the readout operation shown in FIG. 5 has the following effects:

Since the sense amplifying operation with respect to first bit lines BL1 and $\overline{BL1}$ and that with respect to second bit lines BL2 and $\overline{BL2}$ are effected at different timings, variation in the total current I ($=ICC+Iss$) with respect to time occurs twice, that is, when first bit lines BL1 and $\overline{BL1}$ are charged and discharged and when second bit lines BL2 and $\overline{BL2}$ are charged and discharged. Therefore, variation in the total current [dI/dt] becomes small in comparison with the case where the variation occurs once, achieving the stable operation of the DRAM.

Further, the degree of freedom for the circuit design of control circuits 20 and 22 can be improved.

This invention has been described with reference to the aforementioned embodiment, but the invention is not limited only to the above embodiment, and various modifications can be made without departing from the technical scope of this invention.

Figure 6A:
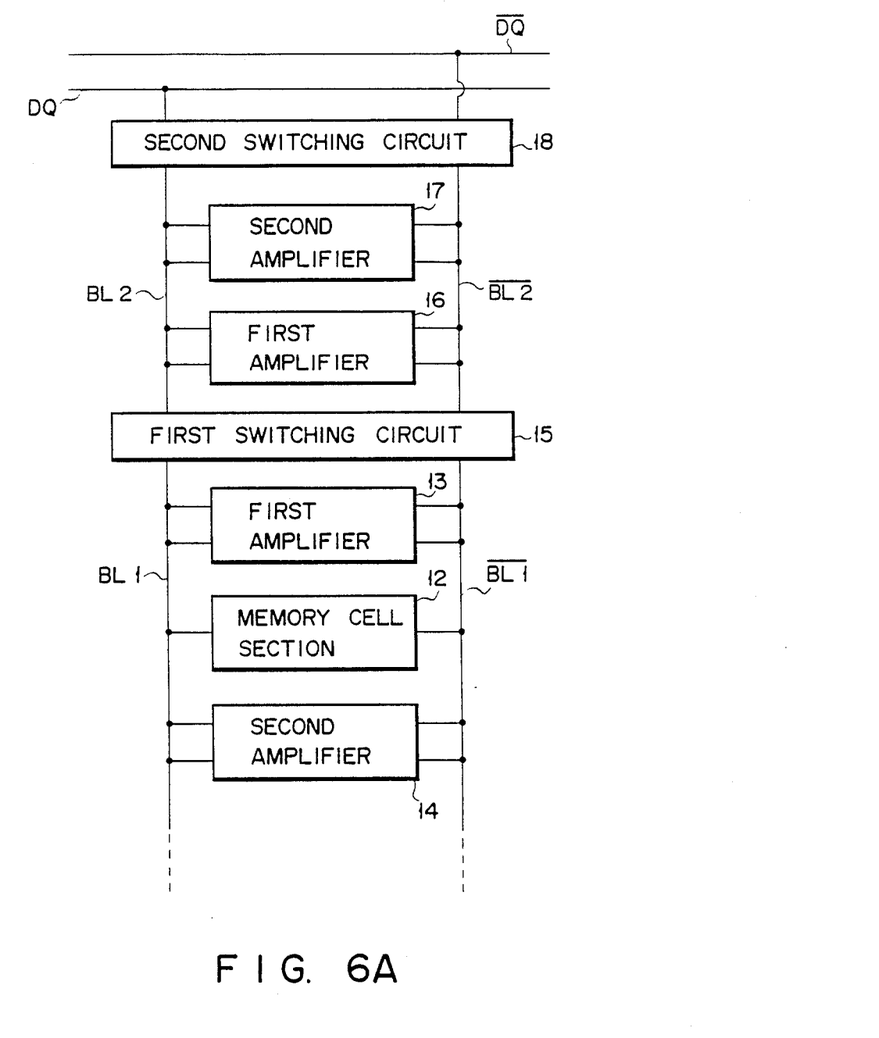
FIGS. 6A and 6B are modifications of the DRAM shown in FIG. 2.

For example, as shown in FIG. 6A, memory section 12 may be located between first and second sense amplifiers 13 and 14. It is necessary to connect first sense amplifier circuit SA1 between first bit lines BL1 and $\overline{BL1}$ and second sense amplifier circuit SA2 between second bit lines BL2 and $\overline{BL2}$, but it is not necessary to specify the positional order of the first and second amplifiers with respect to the direction in which readout data is transferred.

Figure 6B:
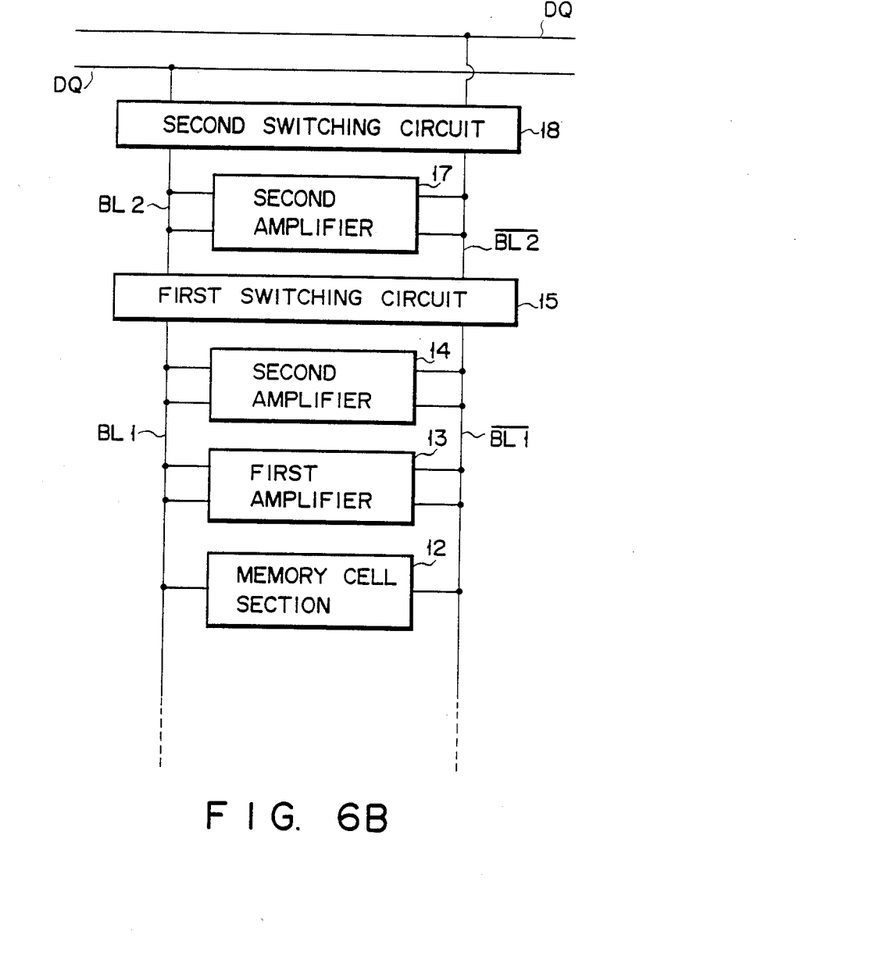

In the case where the potential of data lines DQ and $\overline{DQ}$ at the time of precharge is set at a VCC level, it is not necessary to include first amplifier 16 in second sense amplifying circuit SA2, as shown in FIG. 6B. This is because the parasitic capacitance of second bit lines BL2 and $\overline{BL2}$ is small and the potential of data lines DQ and $\overline{DQ}$ can be set at a level sufficiently close to "H" level without first amplifier 16.

In the embodiment, control circuits 20 and 22 are controlled by signals $\overline{RAS1}$ and $\overline{RAS2}$ generated from switching control circuit 21. However, it is possible to directly control them by $\overline{RAS}$.

What is claimed is:

1. A semiconductor memory device comprising:
   a memory section comprising dynamic memory cells;

a pair of first bit lines connected to said memory section, which are set to different potentials in accordance with data read out from said memory section;

restore means connected to the pair of first bit lines for sensing and amplifying the potential difference between the pair of first bit lines to store data equivalent to the readout data in said memory section;

a pair of second bit lines;

switching means connected between the pair of first bit lines and the pair of second bit lines, for coupling the pair of first bit lines to the pair of second bit lines to transfer the potential difference between the pair of first bit lines to the pair of second bit lines, and for decoupling the pair of first bit lines from the pair of second bit lines in response to a switching control signal to electrically isolate the pair of second bit lines from the pair of first bit lines;

output means connected to the pair of second bit lines for sensing and amplifying the potential difference between the pair of second bit lines; and control means coupled to said switching means for providing the switching control signal to said switching means, after the potential difference between the pair of first bit lines is transferred to the pair of second bit lines and before the potential difference between the pair of first bit lines is amplified to store data equivalent to the readout data in the memory section.

2. A semiconductor memory device according to claim 1, wherein said restore means includes a sense amplifier circuit connected between the pair of first bit lines.

3. A semiconductor memory device according to claim 1, wherein said output means includes a sense amplifier circuit connected between the pair of second bit lines.

4. A semiconductor memory device according to claim 1, wherein said restore means includes a first sense amplifier circuit connected between the pair of first bit lines, and said output means includes a second sense amplifier circuit connected between the pair of second bit lines.

5. A semiconductor memory device according to claim 4, wherein said control means is responsive to activation of a row address control signal, and provides the switching control signal to the switching means a preset time after the row address control signal is activated.

6. A semiconductor memory device according to claim 4, wherein the current driving ability of said first sense amplifier circuit is set smaller than that of said second sense amplifier circuit.

7. A semiconductor memory device according to claim 6, wherein said control means is responsive to activation of a row address control signal, and provides the switching control signal to the switching means a preset time after the row address control signal is activated.

8. A semiconductor memory device according to claim 4, wherein said output means further includes a pair of data lines and a second switching means, connected between the pair of data lines and the pair of second bit lines, for electrically connecting the pair of second bit lines to the pair of data lines after the potential difference between the pair of second bit lines has been amplified.

9. A semiconductor memory device according to claim 8, wherein said control means is responsive to activation of a row address control signal, and provides the switching control signal to the switching means a preset time after the row address control signal is activated.

10. A semiconductor memory device according to claim 8, wherein the current driving ability of said first sense amplifier circuit is set smaller than that of said second sense amplifier circuit.

11. A semiconductor memory device according to claim 10, wherein said control means is responsive to activation of a row address control signal, and provides the switching control signal to the switching means a preset time after the row address control signal is activated.

12. A semiconductor memory device according to claim 4, wherein said first bit lines have a parasitic capacitance larger than that of said second bit lines, and the current driving ability of said first sense amplifier circuit is set smaller than that of said second sense amplifier circuit.

13. A semiconductor memory device according to claim 12, wherein said output means further includes a pair of data lines and a second switching means, connected between the pair of data lines and the pair of second bit lines, for electrically connecting the pair of second bit lines to the pair of data lines after the potential difference between the pair of second bit lines has been amplified.

14. A semiconductor memory device according to claim 12, wherein said control means is responsive to activation of a row address control signal.

15. A semiconductor memory device according to claim 14, wherein the first sense amplifier circuit in the restore means amplifies the potential difference between the pair of first bit lines in response to a first amplifier control signal, wherein the second sense amplifier circuit in the output means amplifies the potential difference between the pair of second bit lines in response to a second amplifier control signal having substantially the same timing as the first amplifier control signal, and wherein said control means includes a control section for respectively providing the first and second amplifier control signals to the restore means and to the output means after providing the switching control signal to the switching means.

16. A semiconductor memory device according to claim 14, wherein the first sense amplifier circuit in the restore means amplifies the potential difference between the pair of first bit lines in response to a first amplifier control signal, wherein the second sense amplifier circuit in the output means amplifies the potential difference between the pair of second bit lines in response to a second amplifier control signal, and wherein said control means includes a control section, for providing the second amplifier control signal to the output means after providing the switching control signal to the switching means, and for providing the first amplifier control signal to the restore means after providing the second amplifier control signal to the output means, thereby reducing the total current variation when data is read out of the memory device.

17. A semiconductor memory device according to claim 1, wherein said control means is responsive to activation of a row address control signal, and provides the switching control signal to the switching means a preset time after the row address control signal is activated.

18. A semiconductor memory device according to claim 1, wherein the current driving ability of said restore means is set smaller than that of said output means.

19. A semiconductor memory device according to claim 18, wherein said control means is responsive to activation of a row address control signal, and provides the switching control signal to the switching means a preset time after the row address control signal is activated.

20. A semiconductor memory device according to claim 1, wherein said output means further includes a pair of data lines and a second switching means, connected between the pair of data lines and the pair of second bit lines, for electrically connecting the pair of second bit lines to the pair of data lines after the potential difference between the pair of second bit lines has been amplified.

21. A semiconductor memory device according to claim 20, wherein said control means is responsive to activation of a row address control signal, and provides the switching control signal to the switching means a preset time after the row address control signal is activated.

22. A semiconductor memory device according to claim 20, wherein the current driving ability of said restore means is set smaller than that of said output means.

23. A semiconductor memory device according to claim 22, wherein said control means is responsive to activation of a row address control signal, and provides the switching control signal to the switching means a preset time after the row address control signal is activated.

24. A semiconductor memory device according to claims 1, 17, 18, 19, 20, 21, 22, or 23, wherein the restore means amplifies the potential difference between the pair of first bit lines in response to a first amplifier control signal, wherein the output means amplifies the potential difference between the pair of second bit lines in response to a second amplifier control signal having substantially the same timing as the first amplifier control signal, and wherein said control means includes a control section for respectively providing the first and second amplifier control signals to the restore means and to the output means after providing the switching control signal to the switching means.

25. A semiconductor memory device according to claim 1, 13, 18, 19, 20, 21, 22, or 23, wherein the restore means amplifies the potential difference between the pair of first bit lines in response to a first amplifier control signal, wherein the output means amplifies the potential difference between the pair of second bit lines in response to a second amplifier control signal, and wherein said control means includes a control section for providing the first amplifier control signal to the restore means and for providing the second amplifier control signal to the output means, after providing the switching control signal to the switching means.

26. A semiconductor memory device according to claim 25, wherein the control section provides the first amplifier control signal to the restore means after providing the second amplifier control signal to the output means, thereby reducing the total current variation when data is read out of the memory device.

27. A semiconductor memory device according to claims 1, 17, 18, 19, 20, 21, 22, or 23, wherein the restore means amplifies the potential difference between the pair of first it lines, and the output means amplifies the potential difference between the pair of second bit lines, after the pair of second bit lines is electrically isolated from the pair of first bit lines.

28. A semiconductor memory device according to claim 27, wherein the restore means amplifies the potential difference between the pair of first bit lines in response to a first amplifier control signal, wherein the output means amplifies the potential difference between the pair of second bit lines in response to a second amplifier control signal having substantially the same timing as the first amplifier control signal, and wherein said control means includes a control section for respectively providing the first and second amplifier control signals to the restore means and to the output means after providing the switching control signal to the switching means.

29. A semiconductor memory device according to claim 27, wherein the restore means amplifies the potential difference between the pair of first bit lines in response to a first amplifier control signal, wherein the output means amplifies the potential difference between the pair of second bit lines in response to a second amplifier control signal, and wherein said control means includes a control section for providing the first amplifier control signal to the restore means and for providing the second amplifier control signal to the output means, after providing the switching control signal to the switching means.

30. A semiconductor memory device according to claim 29, wherein the control section provides the first amplifier control signal to the restore means after providing the second amplifier control signal to the output means, thereby reducing the total current variation when data is read out of the memory device.

* * * * *

UNITED STATES PATENT AND TRADEMARK OFFICE
CERTIFICATE OF CORRECTION

PATENT NO. : 4,980,863
DATED : December 25, 1990
INVENTOR(S) : Masaki Ogihara

It is certified that error appears in the above-identified patent and that said Letters Patent is hereby corrected as shown below:

Title page:

Item (63): Related U.S. Application Data, change "174,393" to --174,893--.

Abstract, line 16, change "finnished" to --finished--.

Column 5, line 10, after "SA1" delete [; and].

Claim 25, column 9, line 51, change "13" to --17--.

Claim 27, column 10, line 18, change "it" to --bit--.

Signed and Sealed this

Twenty-second Day of February, 1994

Attest:

BRUCE LEHMAN

*Attesting Officer*   Commissioner of Patents and Trademarks